(12) United States Patent
Fan et al.

(10) Patent No.: US 7,410,830 B1
(45) Date of Patent: Aug. 12, 2008

(54) LEADLESS PLASTIC CHIP CARRIER AND METHOD OF FABRICATING SAME

(75) Inventors: Chun Ho Fan, Tsuen Wan (HK); Tsui Yee Lin, Kowloon (HK); Ping Sheung Lau, Wong Tai Sin (HK)

(73) Assignee: ASAT Ltd, Tsuen Wan, New Territories (HK)

( * ) Notice: Subject to any disclaimer, the term of this patent is extended or adjusted under 35 U.S.C. 154(b) by 118 days.

(21) Appl. No.: 11/234,963

(22) Filed: Sep. 26, 2005

(51) Int. Cl.
*H01L 21/00* (2006.01)

(52) U.S. Cl. ............... 438/111; 438/124; 438/122; 257/675; 257/707

(58) Field of Classification Search ........... 438/111, 438/112, 113, 122, 123, 124, 127; 257/666, 257/676, 675, 706, 707
See application file for complete search history.

(56) References Cited

U.S. PATENT DOCUMENTS

| | | | |
|---|---|---|---|
| 4,530,152 A | 7/1985 | Roche et al. | |
| 4,685,998 A | 8/1987 | Quinn et al. | |
| 4,812,896 A | 3/1989 | Rothgery et al. | |
| 5,066,831 A | 11/1991 | Spielerger et al. | |
| 5,157,480 A | 10/1992 | McShane et al. | |
| 5,200,362 A | 4/1993 | Lin et al. | |
| 5,200,809 A | 4/1993 | Kwon | |
| 5,214,845 A | 6/1993 | King et al. | |
| 5,216,278 A | 6/1993 | Lin et al. | |
| 5,221,642 A | 6/1993 | Burns | |
| 5,273,938 A | 12/1993 | Lin et al. | |
| 5,277,972 A | 1/1994 | Sakumoto et al. | |
| 5,279,029 A | 1/1994 | Burns | |
| 5,293,072 A | 3/1994 | Tsuji et al. | |
| 5,332,864 A | 7/1994 | Liang et al. | |
| 5,343,076 A | 8/1994 | Katayama et al. | |
| 5,394,298 A * | 2/1995 | Sagisaka | 361/704 |
| 5,406,124 A | 4/1995 | Morita et al. | |
| 5,424,576 A | 6/1995 | Djennas et al. | |
| 5,438,478 A * | 8/1995 | Kondo et al. | 361/704 |
| 5,444,301 A | 8/1995 | Song et al. | |
| 5,457,340 A | 10/1995 | Templeton, Jr. et al. | |
| 5,474,958 A | 12/1995 | Djennas et al. | |
| 5,483,099 A | 1/1996 | Natarajan et al. | |
| 5,604,376 A | 2/1997 | Hamburgen et al. | |
| 5,608,267 A | 3/1997 | Mahulikar et al. | |
| 5,639,990 A | 6/1997 | Nishihara et al. | |
| 5,640,047 A | 6/1997 | Nakashima | |
| 5,641,997 A | 6/1997 | Ohta et al. | |
| 5,646,831 A | 7/1997 | Manteghi | |
| 5,650,663 A | 7/1997 | Parthasarathi | |
| 5,683,806 A | 11/1997 | Sakumoto et al. | |

(Continued)

FOREIGN PATENT DOCUMENTS

JP 59-208756 11/1984

*Primary Examiner*—S. V. Clark
(74) *Attorney, Agent, or Firm*—Morrison & Foerster LLP

(57) ABSTRACT

A process for fabricating a leadless plastic chip carrier includes providing a leadframe including a plurality of contacts circumscribing a void; fixing a heat sink to the contacts of the leadframe using an intermediate non-electrically conductive adhesive such that the heat sink spans the void; mounting a semiconductor die to the heat sink in the void; wire bonding ones of the contacts to the pads of the semiconductor die; encapsulating the semiconductor die and the wire bonds in a molding material and singulating the leadless plastic chip carrier.

22 Claims, 9 Drawing Sheets

U.S. PATENT DOCUMENTS

| | | |
|---|---|---|
| 5,696,666 A | 12/1997 | Miles et al. |
| 5,701,034 A | 12/1997 | Marrs |
| 5,710,064 A | 1/1998 | Song et al. |
| 5,710,695 A | 1/1998 | Manteghi |
| 5,777,382 A | 7/1998 | Abbott et al. |
| 5,894,108 A | 4/1999 | Mostafazadeh et al. |
| 5,976,912 A | 11/1999 | Fukutomi et al. |
| 6,001,671 A | 12/1999 | Fjelstad |
| 6,057,601 A | 5/2000 | Lau et al. |
| 6,124,637 A | 9/2000 | Freyman et al. |
| 6,194,786 B1 | 2/2001 | Orcutt |
| 6,229,200 B1 | 5/2001 | McLellan et al. |
| 6,294,830 B1 | 9/2001 | Fjelstad |
| 6,306,685 B1 | 10/2001 | Liu et al. |
| 6,380,048 B1 * | 4/2002 | Boon et al. ............... 438/456 |
| 6,459,163 B1 | 10/2002 | Bai |
| 6,489,557 B2 | 12/2002 | Eskildsen et al. |
| 6,498,099 B1 | 12/2002 | McLellan et al. |
| 6,528,877 B2 | 3/2003 | Ernst et al. |
| 6,552,417 B2 * | 4/2003 | Combs ....................... 257/666 |
| 6,585,905 B1 | 7/2003 | Fan et al. |
| 6,635,957 B2 | 10/2003 | Kwan et al. |
| 6,724,071 B2 * | 4/2004 | Combs ....................... 257/666 |
| 6,762,118 B2 | 7/2004 | Liu et al. |
| 6,853,059 B1 * | 2/2005 | Jang ........................... 257/675 |
| 7,091,594 B1 * | 8/2006 | Kim et al. .................. 257/687 |
| 7,262,491 B2 * | 8/2007 | Islam et al. ................ 257/670 |
| 2002/0056856 A1 * | 5/2002 | Mclellan et al. ............. 257/200 |
| 2003/0015780 A1 | 1/2003 | Kang et al. |
| 2003/0030131 A1 * | 2/2003 | Lee et al. .................... 257/666 |
| 2003/0038382 A1 * | 2/2003 | Combs ....................... 257/796 |
| 2005/0121756 A1 | 6/2005 | Chow et al. ................ 257/676 |
| 2005/0263864 A1 * | 12/2005 | Islam et al. ................ 257/676 |
| 2007/0052070 A1 * | 3/2007 | Islam et al. ................ 257/666 |
| 2007/0178628 A1 * | 8/2007 | Lim ........................... 438/113 |

* cited by examiner

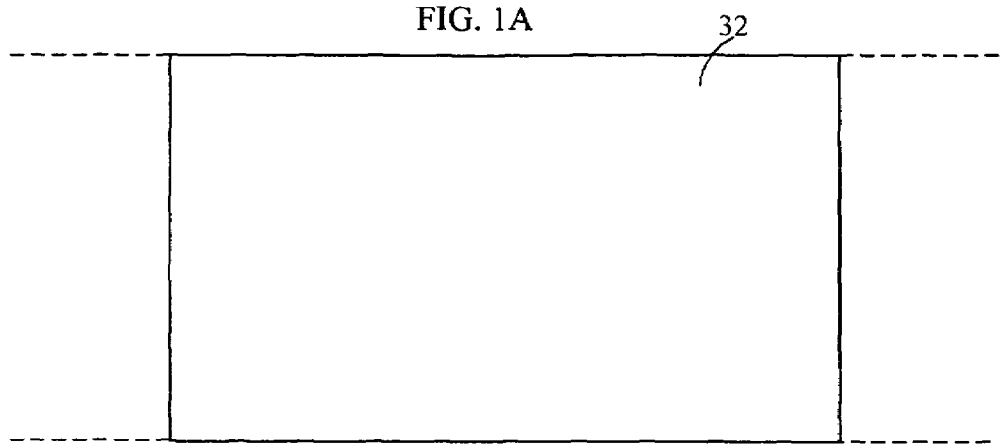
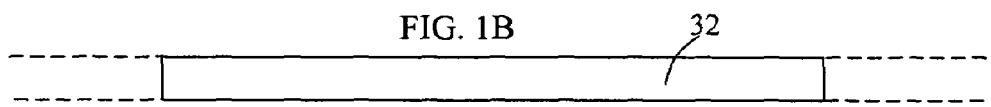
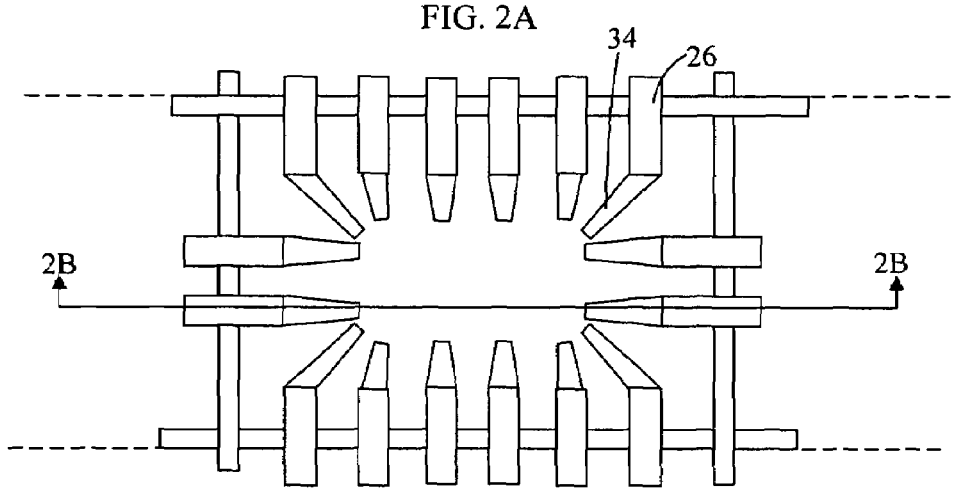
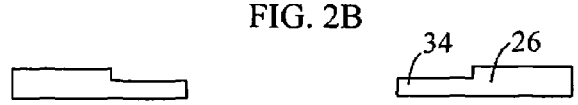

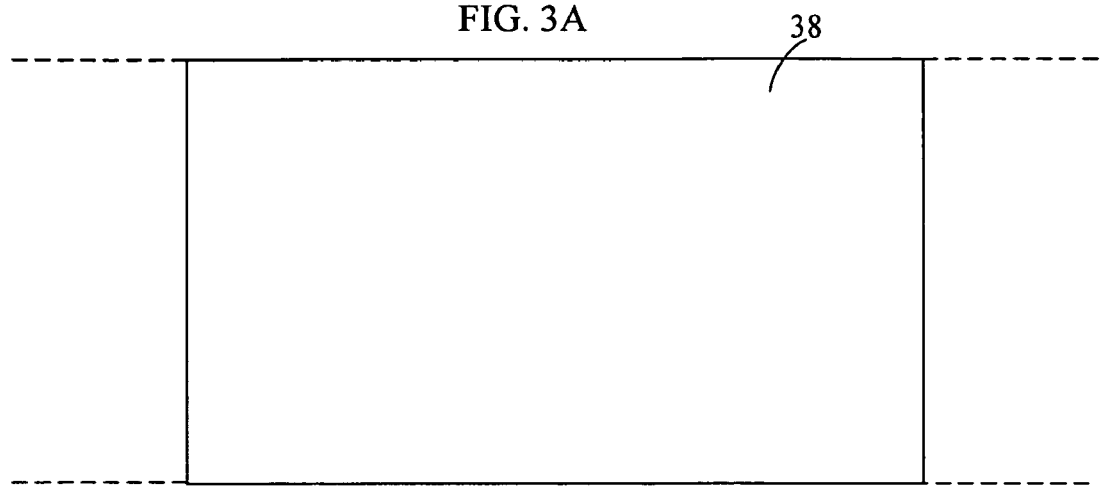
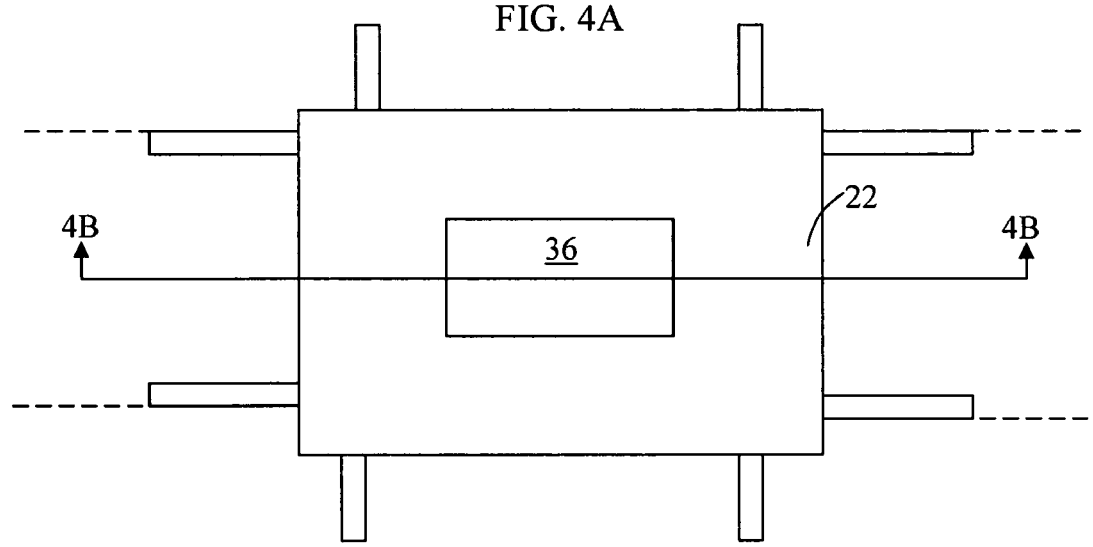
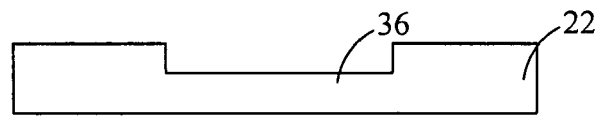

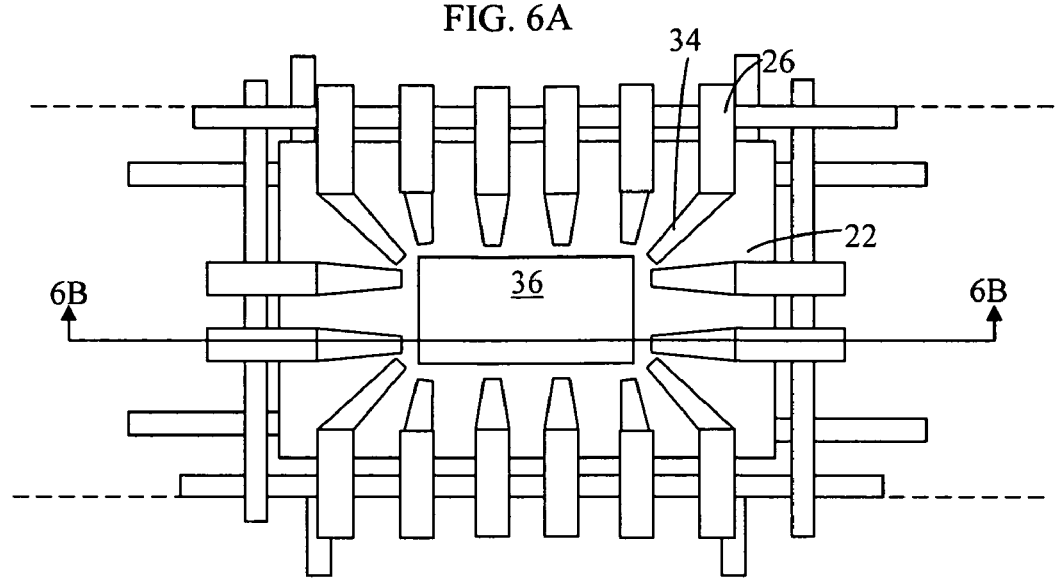
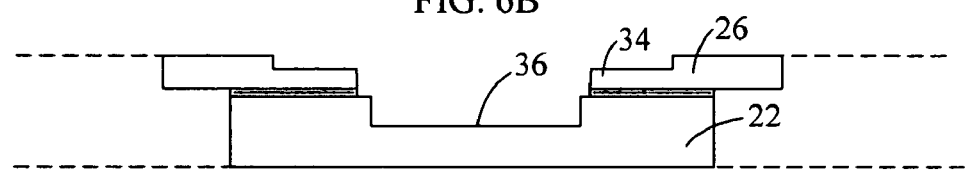
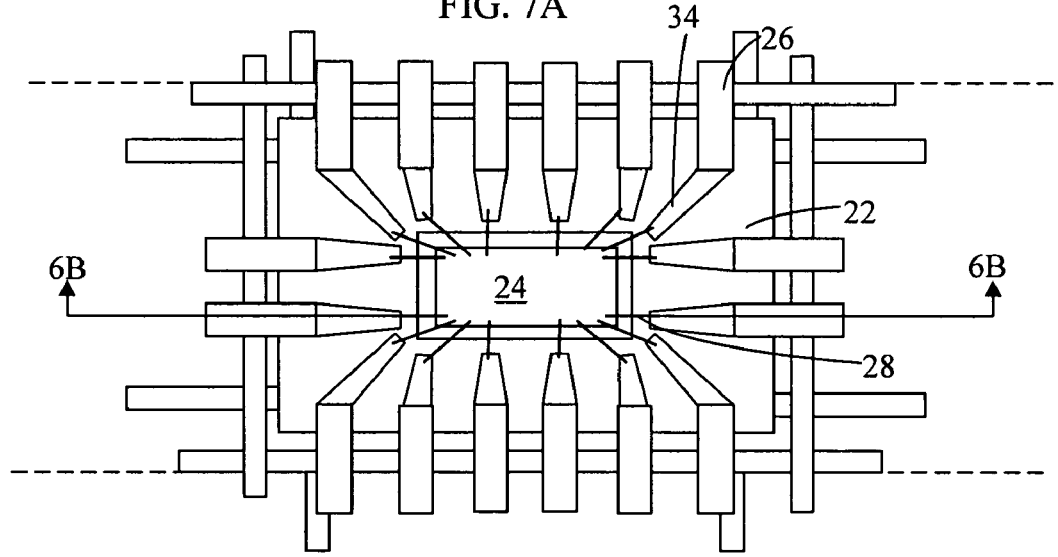
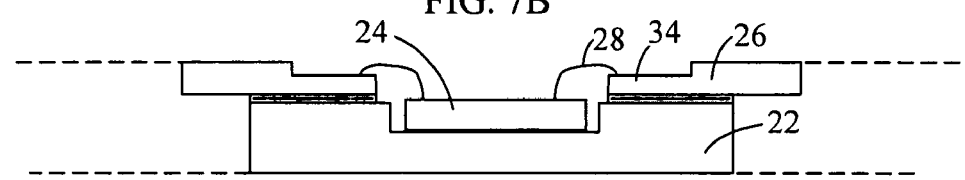

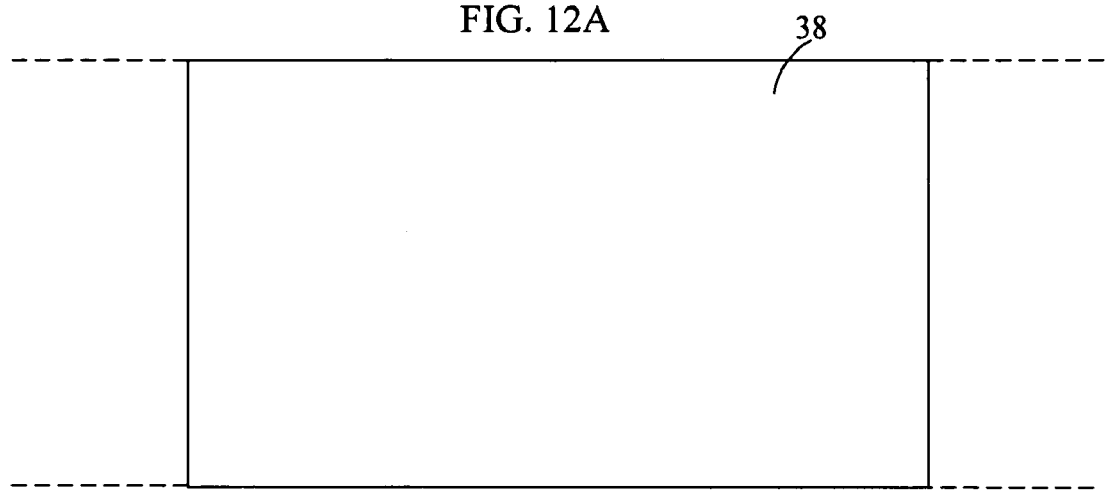
FIG. 12A
FIG. 12B
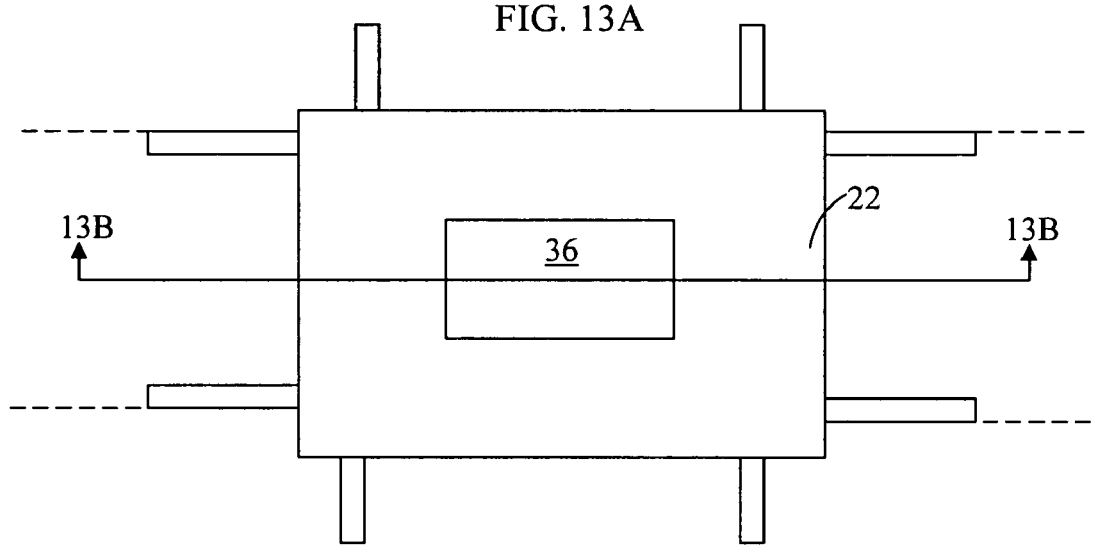
FIG. 13A
FIG. 13B

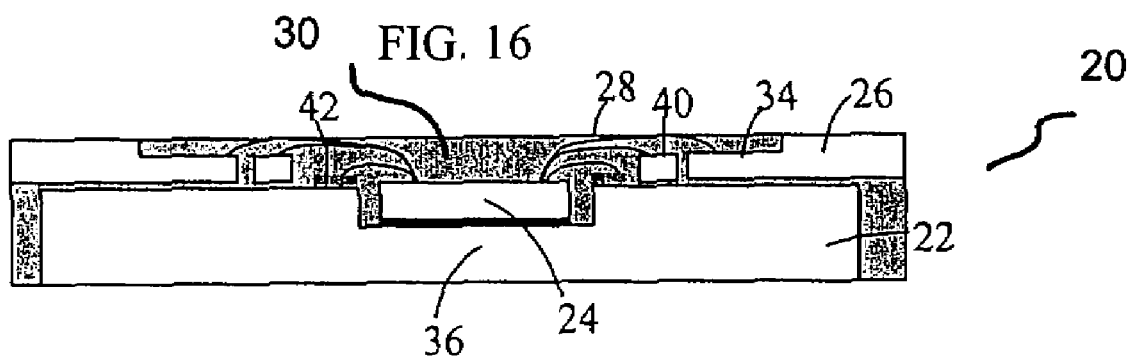

LEADLESS PLASTIC CHIP CARRIER AND METHOD OF FABRICATING SAME

FIELD OF THE INVENTION

The present invention relates in general to integrated circuit packaging, and more particularly to a leadless plastic chip carrier with features for improved thermal performance.

BACKGROUND OF THE INVENTION

According to well known prior art IC (integrated circuit) packaging methodologies, semiconductor dice are singulated and mounted using epoxy or other conventional means onto respective die attach pads of a leadframe strip. Traditional QFP (Quad Flat Pack) packages incorporate inner leads which function as lands for wire bonding the semiconductor die bond pads. These inner leads typically require mold locking features to ensure proper positioning of the leadframe strip during subsequent molding to encapsulate the package. The inner leads terminate in outer leads that are bent down to contact a mother board, thereby limiting the package density of such prior art devices.

In order to overcome these and other disadvantages of the prior art, the Applicants previously developed a Leadless Plastic Chip Carrier (LPCC). According to Applicants' LPCC fabrication methodology, a leadframe strip is provided for supporting up to several hundred devices. Singulated IC dice are placed on the strip die attach pads using conventional die mount and epoxy techniques. After curing of the epoxy, the dice are gold wire bonded to peripheral internal leads. The leadframe strip is then molded in plastic or resin using a modified mold in which the bottom cavity is a flat plate. In the resulting molded package, the die pad and leadframe inner leads are exposed. By exposing the bottom of the die attach pad, mold delamination at the bottom of the die attach pad is inhibited, thereby increasing the moisture sensitivity performance. Also, thermal performance of the IC package is improved by providing a direct thermal path from the exposed die attach pad to the motherboard. By exposing the leadframe inner leads, the requirement for mold locking features is eliminated and no external lead standoff is necessary, thereby increasing device density and reducing package thickness over prior art methodologies. The exposed inner leadframe leads function as solder pads for motherboard assembly such that less gold wire bonding is required as compared to prior art methodologies, thereby improving electrical performance in terms of board level parasitics and enhancing design flexibility over prior art packages (i.e. custom trim tools and form tools are not required). These and several other advantages of Applicants' own prior art LPCC process are detailed in Applicants' U.S. Pat. No. 6,229,200, issued May 8, 2001, the entire contents of which are incorporated herein by reference.

Applicant's LPCC production methodology utilizes saw singulation to isolate the perimeter I/O row as well as multi-row partial lead isolation. Specifically, the leadframe strip is mounted to a wafer saw ring using adhesive tape and saw-singulated using a conventional wafer saw. The singulation is guided by a pattern formed by fiducial marks on the second side (bottom) of the leadframe strip. Also, special mold processing techniques are used to keep the mold from bleeding onto the functional pad area and inhibiting electrical contact. Specifically, the exposed die pad surface is required to be deflashed after molding to remove any molding compound residue and thereby allow the exposed leads and die attach pad to serve as solder pads for attachment to the motherboard.

According to Applicant's own U.S. Pat. No. 6,498,099, issued Dec. 24, 2002, the contents of which are incorporated herein by reference, a localized etch process is provided for the improved manufacture of the LPCC IC package. The leadframe strip is subjected to a partial etch on one or both of the top and bottom sides in order to create a pattern of contact pads and a die attach pad.

Further improvements in IC packages are driven by industry demands for increased electrical performance and decreased size and cost of manufacture. With continued improvements in electrical performance and decreasing package size, improvements in thermal performance are needed. In particular, further improvements in heat dissipation are desirable, particularly in high power applications.

SUMMARY OF THE INVENTION

In one aspect of the present invention, there is provided a process for fabricating a leadless plastic chip carrier that includes: providing a leadframe including a plurality of contacts circumscribing a void; fixing a heat sink to the contacts of the leadframe using an intermediate non-electrically conductive adhesive such that the heat sink spans the void; mounting a semiconductor die to the heat sink in the void; wire bonding ones of the contacts to the pads of the semiconductor die; encapsulating the semiconductor die and the wire bonds in a molding material and singulating the leadless plastic chip carrier.

In another aspect of the present invention, there is provided a leadless plastic chip carrier. The leadless plastic chip carrier includes a heat sink. A semiconductor die is fixed to the heat sink using an intermediary electrically non-conductive adhesive. A plurality of contacts are fixed to the heat sink such that the contacts circumscribe the semiconductor die. A plurality of wire bonds connect pads of the semiconductor die to ones of the contacts and a molding material encapsulates the semiconductor die and the wire bonds.

Advantageously, the heat sink provides a direct thermal path from the semiconductor die to the exterior of the package. The use of any thermally conductive but non-electrically conductive adhesive allows heat from the semiconductor die to be transferred from the exposed heat sink or through the adhesive to the contacts which are soldered to the motherboard. In embodiments of the present invention, a cavity is provided in the heat sink and the semiconductor die is mounted in the cavity. This feature allows for shorter wire bond lengths which results in decreased electrical impedance and increased thermal performance.

The integrated circuit package according to embodiments of the present invention is suitable for high power applications in which a motherboard has insufficient heat capacity to dissipate all heat from the semiconductor die. Further, the integrated circuit package is suitable in applications in which insufficient space is available on the motherboard for soldering a die attach pad. The integrated circuit package according to embodiments of the present invention provides for a heat sink that acts as a die attach pad on an opposite side of input/output contact leads. The heat sink (die attach pad) dimension can be standard for a particular package dimension, independent to the semiconductor die size and wire bond requirement, thereby providing a cost effective design that also provides for integration of power and ground signals in the package.

BRIEF DESCRIPTION OF THE DRAWINGS

The present invention will be better understood with reference to the drawings and the following description, in which like numeral denote like parts and in which:

FIGS. 1 to 9 show process steps for fabricating a leadless plastic chip carrier (LPCC) in accordance with an embodiment of the present invention; and FIGS. 10 to 16 show process steps for fabricating a leadless plastic chip carrier in accordance with another embodiment of the present invention.

DETAILED DESCRIPTION OF THE PREFERRED EMBODIMENT

Figure 5:
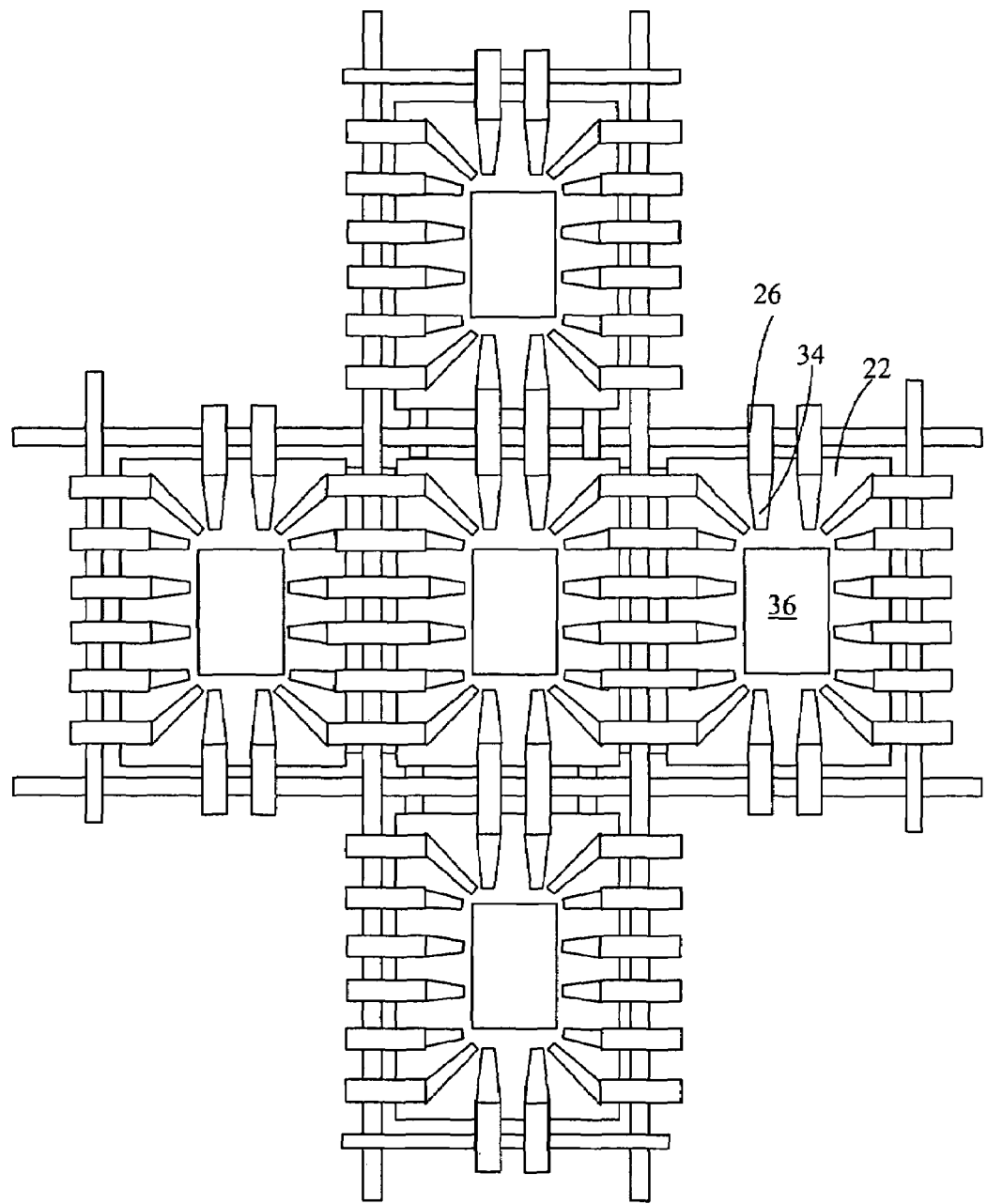

Reference is made to FIGS. 1 to 9 to describe a leadless plastic chip carrier (LPCC) according to one embodiment of the present invention, indicated generally by the numeral 20. The leadless plastic chip carrier 20 includes a heat sink 22 and a semiconductor die 24 is fixed to the heat sink 22 using an intermediary electrically non-conductive adhesive. A plurality of contacts 26 are fixed to the heat sink 22 such that the contacts 26 circumscribe the semiconductor die 24. A plurality of wire bonds 28 connect pads of the semiconductor die 24 to ones of the contacts 26 and a molding material 30 encapsulates the semiconductor die 24 and the wire bonds 28.

A process for manufacturing the LPCC package 20 will now be described in more detail. Referring to FIGS. 1A and 1B, there is provided an elevation view and a sectional side view, respectively, of a copper panel substrate 32 which forms the raw material of the leadframe strip. As discussed in greater detail in Applicants' own U.S. Pat. No. 6,229,200, issued May 8, 2001, the leadframe strip is divided into a plurality of sections, each of which incorporates a plurality of leadframe units in an array (e.g. 3×3 array, 5×5 array, etc.). For the purpose of simplicity and clarity, not all units are shown in the Figures. Portions of adjacent units are indicated by stippled lines.

The copper panel substrate 32 is selectively etched by, for example, spin coating a photo-imageable etch resistant mask on both sides of the copper panel substrate 32, selectively exposing the etch resistant mask using a photo tool, developing the etch resistant mask to expose portions of the copper panel substrate, pressurized spray etching the exposed portions of the copper panel substrate 32 and removing the remainder of the etch resistant mask. After removal of the etch resistant mask, the leadframe strip is electrolytically plated with a suitable metal, such as silver (Ag) or successive layers of nickel (Ni), palladium (Pd) and then gold (Au). The resulting leadframe strip is shown in FIGS. 2A and 2B. The leadframe strip includes several leadframe units joined together by partially etched tie bars. Each of the leadframe units includes a plurality of contacts 26 that circumscribe a central void.

As best shown in FIG. 2B, interior portions 34 of the contacts 26 that are closest to the central void are half etched such that the thickness of these interior portions 34 is less than the thickness of the remainder of the contacts 26. The half etch is accomplished by providing an etch resistant mask that is exposed and developed such that the portions of the copper panel substrate 32 that form the interior portions 34 of the contacts 26 are etched on one side while the other side is protected by the etch resistant mask.

Referring now to FIGS. 3A and 3B, a metal panel 38 that provides the raw material for the heat sink 22 is shown. The metal panel 38 is selectively etched by spin coating both sides of the metal panel with a photo-imageable etch resistant mask, selectively exposing the etch resistant mask, developing to expose portions of the metal panel, pressurized spray etching and removing the remainder of the etch resistant mask to provide the heat sink 22 shown in FIGS. 4A and 4B, in the form of an array. The resulting heat sink array includes several heat sinks 22 joined together by partially etched tie bars. Each heat sink 22 includes an etched down central cavity 36.

Next, the heat sink array is fixed to the leadframe strip using an electrically non-conductive adhesive, as best shown in FIG. 5. Referring to FIGS. 6A and 6B, a single heat sink 22 and single leadframe unit are shown. Although the following description refers only to the single heat sink 22 and the single leadframe that are shown, it will be understood that the leadframe is in the form of a leadframe strip and the heat sink 22 is in the form of a heat sink array. The heat sink 22 is fixed to the leadframe by applying a double-sided adhesive tape to the heat sink 22 followed by laminating the contacts 26 to the heat sink 22. The double-sided adhesive tape is a thermally conductive and electrically non-conductive adhesive film and is preformed in a ring. After applying the adhesive film to the heat sink 22, the heat sink 22 is laminated to the contacts 26 by hot pressing. Clearly, the central cavity 36 of the heat sink 22 is aligned with the void of the leadframe such that the interior portions 34 of the contacts 26 that are of reduced thickness are closest to the central cavity 36 of the heat sink 22.

A singulated semiconductor die 24 is conventionally mounted via epoxy (or other suitable means) to the heat sink 22, and the epoxy is cured. As shown in FIGS. 7A and 7B, the semiconductor die 24 is mounted in a central cavity 36 of the heat sink 22 and the contacts 26 circumscribe the semiconductor die 24 such that the interior portions 34 of the contacts 26 that are of reduced thickness are closest to the semiconductor die 24. Pads of the semiconductor die 24 are then wire bonded to the interior portions 34 of ones of the contacts 26 to electrically connect the semiconductor die 24 with the contacts 26.

Figure 8:
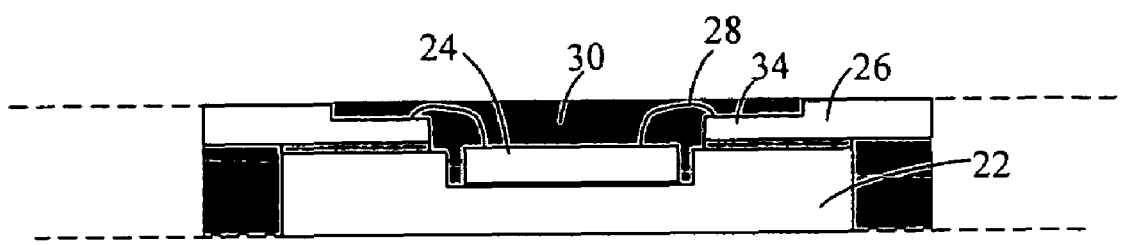

The semiconductor die 24, wire bonds 28 and the interior portions 34 of the contacts 26 are then encapsulated in a molding material 30, as shown in FIG. 8. To encapsulate the semiconductor die 24, the wire bonds 28 and the interior portions 34 of the contacts 26, the laminated heat sink 22 and contacts 26 (in array form) are molded in a modified mold with the bottom cavity being a flat plate, followed by curing of the molding material 30, as discussed in Applicants' U.S. Pat. No. 6,229,200. As shown, a surface of each of the contacts 26 is exposed from the molding material 30. The exposed surface of each of the contacts 26 is located at the part of the contact 26 that is not reduced in thickness, rather than at the interior portion 34.

After encapsulating, the exposed surface of each of the contacts 26 is electrolytically plated with a layer of nickel (Ni).

Figure 9:
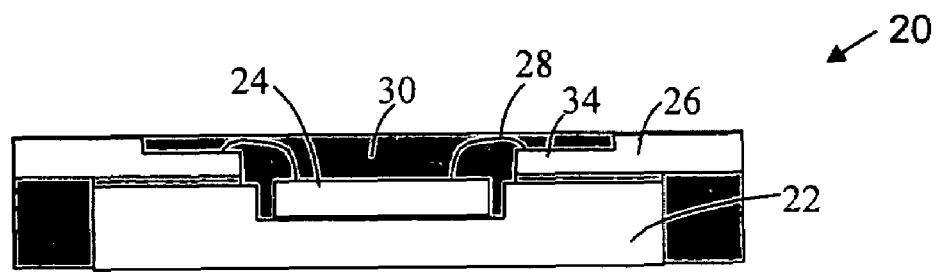

The individual LPCC package 20 is then singulated by, for example, saw singulation. FIG. 9 shows a sectional side view of the singulated LPCC package 20.

Reference is now made to FIGS. 10 to 16 to describe another process for manufacturing an LPCC according to another embodiment of the present invention.

Figure 10A:
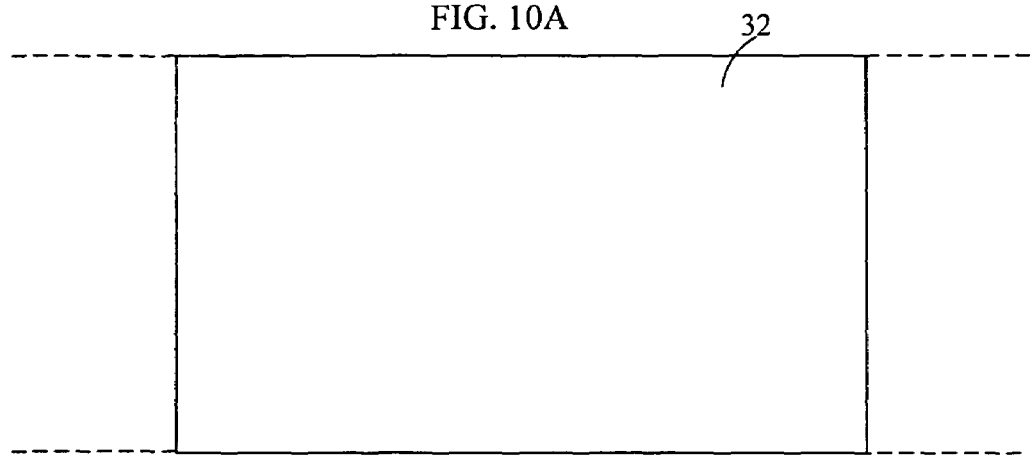
Figure 10B:
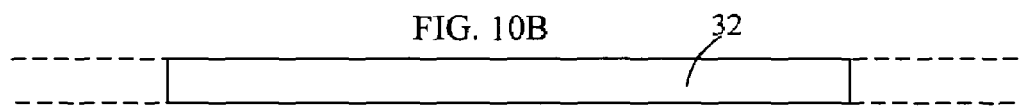

A process for manufacturing the LPCC package 20 will now be described in more detail. Referring to FIGS. 10A and 10B, there is provided an elevation view and a sectional side view, respectively, of a copper panel substrate 32 similar to that of FIGS. 1A and 1B.

Figure 11A:
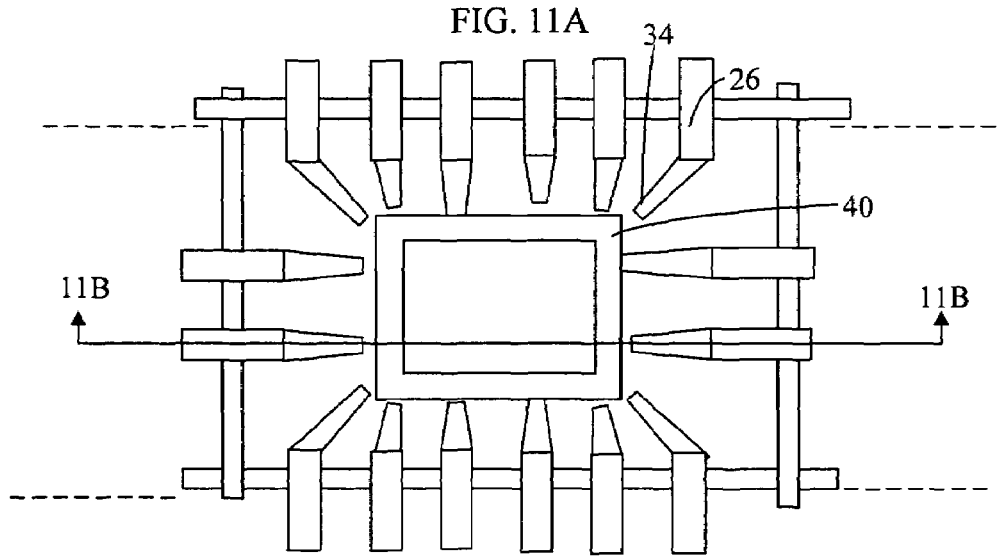
Figure 11B:
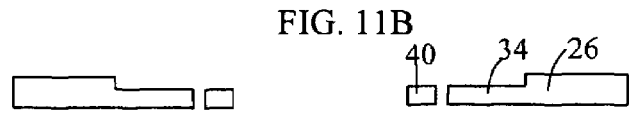

The copper panel substrate 32 is selectively etched and electrolytically plated with a suitable metal, such as silver (Ag) or successive layers of nickel (Ni), palladium (Pd) and then gold (Au). The resulting leadframe strip is shown in FIGS. 11A and 11B. As in the previous embodiment, the leadframe strip includes several leadframe units joined together by partially etched tie bars. Each of the leadframe units includes a plurality of contacts 26 that circumscribe a central void. In the present embodiment, however, each leadframe unit further includes a power ring 40.

As best shown in FIG. 11B, interior portions 34 of the contacts 26 that are closest to the central void are half etched such that the thickness of these interior portions 34 is less than the thickness of the remainder of the contacts 26. As indicated above, each of the leadframe units also includes a power ring 40, between the interior portions 34 of the contacts 26 and the central void. Similar to the interior portions 34 of the contacts, the power ring 40 is also partially etched such that the thickness of the power ring 40 is less than the thickness of the remainder of the contacts 26.

Referring now to FIGS. 12A and 12B, a metal panel 38 that provides the raw material for the heat sink 22 is shown. The metal panel 38 is selectively etched to provide the heat sink 22 including the central cavity 36. In the present embodiment, the heat sink is selectively plated with silver, to form a ground ring 42 surrounding the etched down cavity, as shown in FIGS. 13A and 13B. Again it will be understood that the metal panel 38 is etched and plated in the form of an array. The resulting heat sink array includes several heat sinks 22 joined together by partially etched tie bars. Each heat sink 22 includes the etched down central cavity 36 and the selectively plated silver ground ring 42.

Figure 14A:
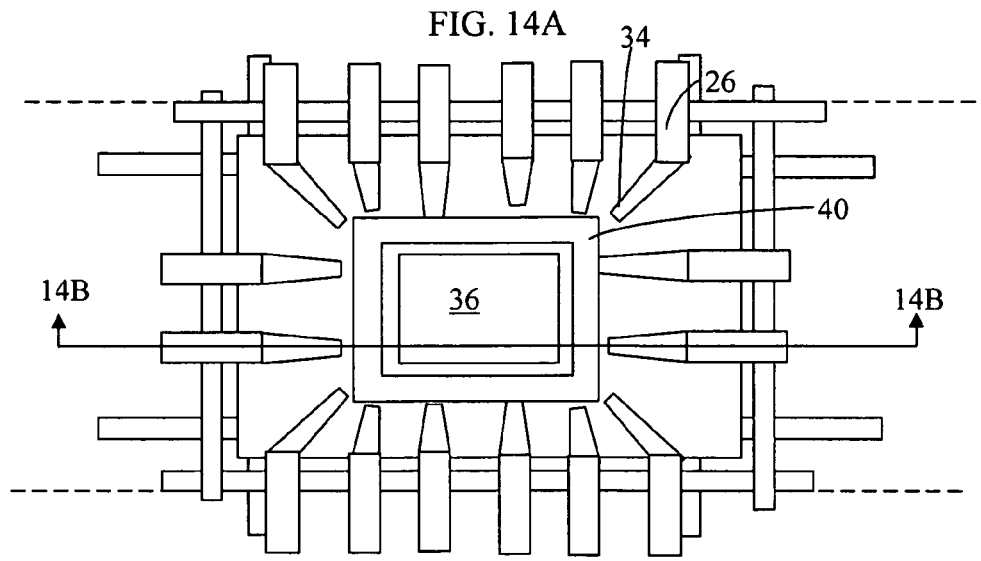
Figure 14B:
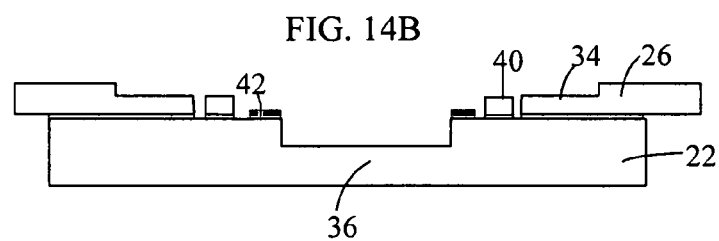

Next, the heat sink array is fixed to the leadframe strip using an electrically non-conductive adhesive. Referring to FIGS. 14A and 14B, a single heat sink 22 and single leadframe unit are shown. Although the following description refers only to the single heat sink 22 and the single leadframe that are shown, it will be understood that the leadframe is in the form of a leadframe strip and the heat sink 22 is in the form of a heat sink array. The heat sink 22 is fixed to the leadframe by applying a double-sided adhesive tape to the heat sink 22 followed by laminating the contacts 26 and power ring 40 to the heat sink 22. The double-sided adhesive tape is a thermally conductive and electrically non-conductive adhesive film and is preformed in a ring. After applying the adhesive film to the heat sink 22, the heat sink 22 is laminated to the contacts 26 and power ring 40 by hot pressing. Clearly, the central cavity 36 of the heat sink 22 is aligned with the void of the leadframe such that the power ring 40 is spaced from and surrounds the ground ring 42.

Figure 15A:
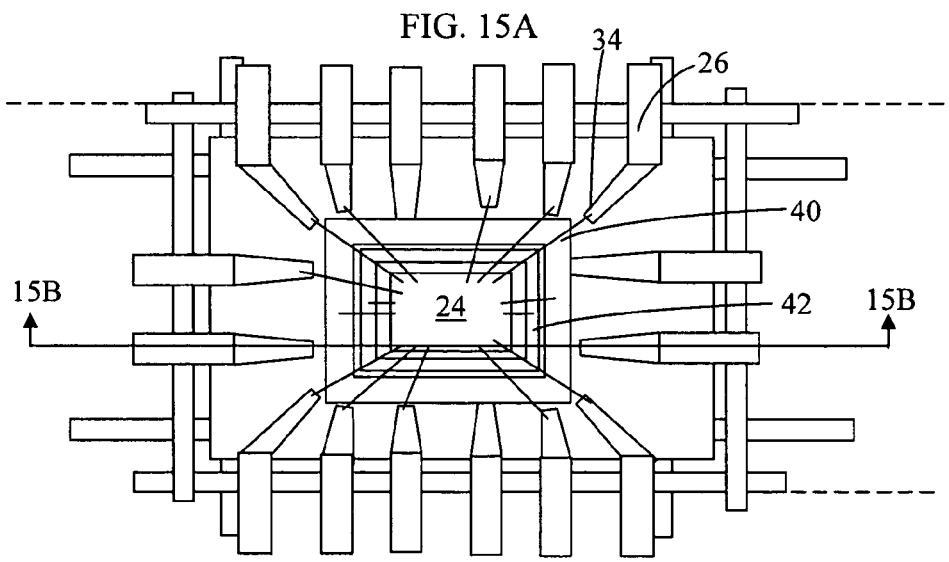
Figure 15B:
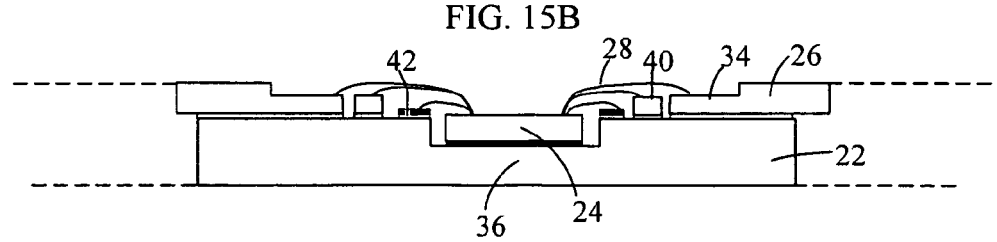

A singulated semiconductor die 24 is conventionally mounted to the central cavity 36 of the heat sink 22, as shown in FIGS. 15A and 15B. Pads of the semiconductor die 24 are then wire bonded to the ground ring 42, the power ring 40 and the interior portions 34 of ones of the contacts 26 to electrically connect the semiconductor die 24 with the ground ring 42, the power ring 40 and the contacts 26.

The semiconductor die 24, wire bonds 28, the ground ring 42, the power ring 40 and the interior portions 34 of the contacts 26 are then encapsulated in a molding material 30 and the exposed surface of each of the contacts 24 is electrolytically plated with a layer of nickel (Ni). Finally the individual LPCC package 20 is singulated, resulting in the package shown in FIG. 16.

Specific embodiments of the present invention have been shown and described herein. However, modifications and variations to these embodiments are possible. For example, the size and shape of many of the features of the LPCC package can vary while still performing the same function. Rather than selectively etching to form the leadframe, the leadframe can be formed by stamping. Similarly, rather than selectively etching to form the heat sink, the heat sink can also be formed by stamping. The leadframe strip can be selectively plated rather than flood plating. Also, the plating is not limited to metals described as other suitable metals can be plated onto the strip. Further, rather than using a double-sided adhesive film tape to fix the heat sink to the contacts, an electrically non-conductive epoxy can be screen printed on the heat sink, followed by placing the leadframe strip on the heat sink and oven curing the epoxy. Other methods of singulation are also possible such as die punching.

Those skilled in the art may conceive of still other modifications and variations. All such modifications and variations are believed to be within the sphere and scope of the present invention.

What is claimed is:

1. A process for fabricating a plurality of leadless plastic chip carriers, comprising:
   providing a leadless plastic chip carrier strip comprising a plurality of leadframes, each leadframe comprising a plurality of contacts circumscribing a void, said contacts having an exterior portion and an interior portion, said interior portion being located between said external portion and said semiconductor die, and said interior portion having a height in a direction normal to an upper surface of said semiconductor die which is less than a height of the exterior portion;
   fixing a heat sink to said plurality of contacts of each leadframe using an electrically non-conductive adhesive such that each heat sink spans one of said voids;
   mounting a semiconductor die to each heat sink, in said void;
   wire bonding at least one of said plurality of contacts of each leadframe to at least one of a plurality of pads of each semiconductor die;
   encapsulating each semiconductor die and said wire bonds in a molding material such that an upper surface of the exterior portion of each of said contacts is exposed, and an interior portion of each of said contacts is encapsulated; and
   singulating said leadless plastic chip carrier strip to form a plurality of leadless plastic chip carriers.

2. The process according to claim 1, wherein providing said leadframe comprises forming said leadframe by one of selectively etching and stamping a metal strip to provide said plurality of contacts circumscribing said void.

3. The process according to claim 1, wherein providing said leadframe comprises forming said leadframe to include said plurality of contacts and a power ring between said plurality of contacts and said void, and wherein said wire bonding further includes wire bonding said power ring to said semiconductor die.

4. The process according to claim 1, further comprising fabricating said heat sink prior to fixing said heat sink to said contacts.

5. The process according to claim 4, wherein fabricating said heat sink comprises one of selectively etching and stamping the metal strip.

6. The process according to claim 4 wherein fabricating said heat sink includes fabricating a ground ring on said heat sink such that said ground ring is disposed interior of said void after fixing said heat sink to said leadframe and wherein wire bonding further includes wire bonding said ground ring to said semiconductor die.

7. The process according to claim 5, wherein fabricating said heat sink comprises forming a cavity in said heat sink, and mounting said semiconductor die to said heat sink comprises mounting said semiconductor die in said cavity.

8. A process for fabricating a plurality of leadless plastic chip carriers, comprising:
providing a leadless plastic chip carrier strip comprising a plurality of leadframes, each leadframe comprising a plurality of contacts circumscribing a void;
fixing a heat sink to said plurality of contacts of each leadframe using an electrically non-conductive adhesive such that each heat sink spans one of said voids;
mounting a semiconductor die to each heat sink, in said void;
wire bonding at least one of said plurality of contacts of each leadframe to at least one of a plurality of pads of each semiconductor die;
encapsulating each semiconductor die and said wire bonds in a molding material such that at least a portion of an upper surface of each of said contacts is exposed, and at least a portion of the upper surface of each of said contacts is encapsulated; and
singulating said leadless plastic chip carrier strip to form a plurality of leadless plastic chip carriers,
wherein fixing said heat sink to said contacts of said leadframe using the electrically non-conductive adhesive comprises applying an electrically non-conductive adhesive film to said heat sink and hot pressing said heat sink to said contacts.

9. A process for fabricating a plurality of leadless plastic chip carriers, comprising:
providing a leadless plastic chip carrier strip comprising a plurality of leadframes, each leadframe comprising a plurality of contacts circumscribing a void;
fixing a heat sink to said plurality of contacts of each leadframe using an electrically non-conductive adhesive such that each heat sink spans one of said voids;
mounting a semiconductor die to each heat sink, in said void;
wire bonding at least one of said plurality of contacts of each leadframe to at least one of a plurality of pads of each semiconductor die;
encapsulating each semiconductor die and said wire bonds in a molding material such that at least a portion of an upper surface of each of said contacts is exposed and at least a portion of the upper surface of each of said contacts is encapsulated; and
singulating said leadless plastic chip carrier strip to form a plurality of leadless plastic chip carriers,
wherein fixing said heat sink to said contacts of said leadframe using the intermediate electrically non-conductive adhesive comprises screen printing an electrically non-conductive epoxy on to said heat sink, locating said leadframe on to said heat sink, and curing said epoxy.

10. The process according to claim 1, further comprising plating a metal on exposed contact surfaces of said contacts after encapsulating.

11. A leadless plastic chip carrier comprising:
a heat sink;
a semiconductor die fixed to said heat sink;
a plurality of contacts fixed to said heat sink by an electrically non-conductive adhesive such that said contacts circumscribe said semiconductor die, said contacts having an exterior portion and an interior portion, said interior portion being located between said external portion and said semiconductor die, and said interior portion having a height in a direction normal to an upper surface of said semiconductor die which is less than a height of the exterior portion;
a plurality of wire bonds connecting at least one of a plurality of pads of said semiconductor die to at least one of said contacts; and
a molding material encapsulating said semiconductor die and said wire bonds such that upper surfaces of said exterior portions of said contacts are exposed from said molding material and said interior portions of said contacts are encapsulated.

12. The leadless plastic chip carrier according to claim 11, wherein said heat sink comprises a cavity and said semiconductor die is fixed to said heat sink in said cavity.

13. The leadless plastic chip carrier according to claim 11, wherein said electrically non-conductive adhesive comprises an electrically non-conductive adhesive film fixed to said heat sink and said contacts.

14. The leadless plastic chip carrier according to claim 11, wherein said electrically non-conductive adhesive comprises an electrically non-conductive epoxy fixed to said heat sink and said contacts.

15. The leadless plastic chip carrier according to claim 11, wherein the surfaces of said contacts that are exposed are plated.

16. The leadless plastic chip carrier according to claim 11, wherein said heat sink is fixed to said interior portions of said contacts.

17. The leadless plastic chip carrier according to claim 16, wherein said wire bonds are connected to said interior portions of ones of said contacts, on a side of said contacts opposite said heat sink.

18. The leadless plastic chip carrier according to claim 11, wherein a surface of said heat sink is exposed.

19. The leadless plastic chip carrier according to claim 11, further comprising a ground ring circumscribing said semiconductor die on said heat sink, pads of said semiconductor die further connecting ones of said pads of said semiconductor die to said ground ring.

20. The leadless plastic chip carrier according to claim 11, further comprising a power ring between said semiconductor die and said contacts, ones of said wire bonds further connecting ones of said pads of said semiconductor die to said power ring.

21. The process according to claim 1, wherein the electrically non-conductive adhesive is thermally conductive.

22. The leadless plastic chip carrier according to claim 11, wherein the electrically non-conductive adhesive is thermally conductive.

* * * * *